United States Patent [19]

Dorfmeyer

[11] Patent Number: 5,777,853
[45] Date of Patent: Jul. 7, 1998

[54] PRINTED CIRCUIT BOARD HAVING A DUAL SQUARE PATTERN FOOTPRINTS FOR RECEIVING ONE OF TWO ELECTRONIC COMPONENTS HAVING EQUAL PRINTOUTS PER SIZE

[75] Inventor: Mitchell G. Dorfmeyer, Corona, Calif.

[73] Assignee: AST Research, Inc., Irvine, Calif.

[21] Appl. No.: 642,572

[22] Filed: May 3, 1996

[51] Int. Cl.⁶ .............................. H05K 7/02; H05K 1/11
[52] U.S. Cl. .......................... 361/777; 174/260; 174/261;
257/700; 257/786; 361/783; 361/760
[58] Field of Search ......................... 174/260, 261;
257/700, 723, 724, 786, 773, 775, 776;
361/748, 760, 777, 783; 439/68, 83; 437/209;
438/108, 110, 111, 125, 129, 611, 369;
228/179.1, 180.1

[56] References Cited

U.S. PATENT DOCUMENTS

| | | | |
|---|---|---|---|
| 3,923,359 | 12/1975 | Newsam | 439/68 |
| 4,511,950 | 4/1985 | Bunner et al. | |
| 4,530,002 | 7/1985 | Kanai | 257/693 |
| 4,613,924 | 9/1986 | Brault | 361/777 |
| 4,840,570 | 6/1989 | Mann, Jr. et al. | |
| 5,064,378 | 11/1991 | Olson et al. | |
| 5,159,536 | 10/1992 | Silverio | |
| 5,258,890 | 11/1993 | de Veer | |
| 5,386,346 | 1/1995 | Gleadall | |
| 5,557,505 | 9/1996 | Silva | |
| 5,571,996 | 11/1996 | Swamy et al. | |

FOREIGN PATENT DOCUMENTS

| | | |
|---|---|---|
| 0171232 | 7/1985 | European Pat. Off. |
| 0246088 | 5/1987 | European Pat. Off. |
| 2233823 | 11/1970 | United Kingdom |
| 2170047 | 1/1985 | United Kingdom |

*Primary Examiner*—Donald Sparks
*Attorney, Agent, or Firm*—Knobbe, Martens, Olson & Bear, LLP

[57] ABSTRACT

A printed circuit board has a first plurality of pin receptors configured to receive a first type of keyboard controller and a second plurality of pin receptors configured to receive a second type of keyboard controller. The first plurality of pin receptors are in the form of a square which defines an outer boundary of an area wherein the second plurality of pin receptors are formed. The second plurality of pin receptors are also in the form of a square. Equal numbers of pin receptors are provided on each side of each square, and the corresponding sides of the two squares are mutually parallel. Conductive traces are formed between corresponding pin receptors of the first and second plurality of pin receptors. The pin receptor configuration allows two different types of keyboard controllers to be used with the printed circuit board without requiring additional space on the printed circuit board.

8 Claims, 3 Drawing Sheets

PRINTED CIRCUIT BOARD HAVING A DUAL SQUARE PATTERN FOOTPRINTS FOR RECEIVING ONE OF TWO ELECTRONIC COMPONENTS HAVING EQUAL PRINTOUTS PER SIZE

BACKGROUND OF THE INVENTION

1. Field of the Invention

The present invention generally relates to printed circuit boards and, more particularly, concerns a printed circuit board having a pattern of pin receptors, known as a footprint, that is capable of receiving one of two different integrated circuit packages on the same location of the printed circuit board.

2. Description of the Related Art

Personal computers typically include a number of printed circuit boards, which have a plurality of electronic components mounted thereon, to provide the personal computer with its function. The electronic components include integrated circuits, such as microprocessors, keyboard controllers, memories and the like, which have a chip positioned within a casing or package and a plurality of pins that are electrically connected to the chip and extend outward of the package so as to make contact with pin receptors mounted on the printed circuit board. The printed circuit board will have a plurality of pin receptors arranged in a pattern, known as a footprint, which is configured so as to receive the pins of the package when the package is mounted on the board. The pin receptors are then electrically connected to conductive traces formed in or on the board which interconnect different integrated circuits to different devices mounted on the printed circuit board.

One difficulty that the manufacturers of personal computers have is that different integrated circuit manufacturers will produce integrated circuits that perform the same function but are positioned in different packages having differing pin configurations. Consequently, the personal computer manufacturer must design a printed circuit board with a particular manufacturer's component chip in mind. In the event that the personal computer manufacturer wishes to use an equivalent integrated circuit from a competing manufacturer, the personal computer manufacturer must redesign the printed circuit board to accommodate the integrated circuit having the new package.

It will be appreciated that redesigning a printed circuit board for different configurations of integrated circuits can be expensive for the personal computer manufacturer, particularly with complex multi-layer printed circuit boards. As an example, personal computers generally include a keyboard controller integrated circuit that is purchased from a keyboard controller manufacturer. There are a number of different manufacturers of keyboard controllers, which results in keyboard controllers having a number of different packages and pin configurations, depending upon the manufacturer. However, each keyboard controller integrated circuit performs the same function and often has the same input and output pins even though the footprint of these pins may vary. Presently, the personal computer manufacturer must select a particular integrated circuit and design one board, thereby eliminating the ability to periodically purchase integrated circuits from competing suppliers, or the manufacturer must periodically redesign the printed circuit board to accommodate keyboard controllers in different package configurations.

Hence, there is a need for a printed circuit board which will allow a personal computer manufacturer to accommodate integrated circuits performing the same function but having different packages and different pin configurations. It will be appreciated, however, that if multiple distinct footprints of pin receptors are provided on a circuit board, a substantial amount of space on the board may be wasted. This can result in increased manufacturing costs and, more importantly, may result in the printed circuit board exceeding its surface area design constraints.

This problem would be particularly accentuated in applications such as laptop computers, wherein space on the surface of the printed circuit boards is at a premium. Thus, there is a need for a footprint configuration for a printed circuit board that is capable of accommodating more than one integrated circuit package, while minimizing the amount of space utilized by the footprint of pin receptors on the printed circuit board. Further, in the particular application of keyboard controllers, there is a need for a printed circuit board that is capable of accommodating one of two different keyboard controller integrated circuits without requiring additional space on the printed circuit board be used by an extra footprint of pin receptors.

SUMMARY OF THE INVENTION

The aforementioned needs are satisfied by the printed circuit board of the present invention, which includes a first plurality of pin receivers formed in a first pattern on a printed circuit board, wherein the first pattern of pin receivers is configured to receive the pins of a integrated circuit package having a first configuration of pins, and wherein the first integrated circuit package covers a first area of the printed circuit board when positioned on the board. The printed circuit board also includes a second pattern of pin receivers formed entirely in the first area of the printed circuit board, wherein the second pattern is configured to receive the pins of a second integrated circuit package having a second plurality of pins. The first and second integrated circuit packages are generally square in shape with an equal number of pinouts per side. Aspect of the invention, the first and second integrated circuits are configured to perform the same function and are also configured so that the pins on the first integrated circuit package have corresponding pins on the second integrated circuit package. In this aspect of the invention, conductive traces are formed between corresponding pin receivers of the first pattern and pin receivers of the second pattern.

In another aspect of the invention, a first plurality of pin receivers are formed on the printed circuit board to form a generally square pattern that outlines a first area of the printed circuit board to receive a first integrated circuit package. A second plurality of pin receivers are also formed on the printed circuit board in a square configuration to receive a second integrated circuit package, wherein each of the second plurality of pin receivers is positioned within the area defined by the first plurality of pin receivers. The first and second integrated circuit packages have an equal number of pinouts per side. Preferably, the first and second integrated circuit packages have the same orientation of output pins so that corresponding pin receivers in the first and second patterns are positioned in corresponding orders in their respective patterns and are interconnected by conductive traces formed on the printed circuit board.

In the preferred embodiment, the first integrated circuit package and the second integrated circuit package contain keyboard controllers. Each of the integrated circuit packages have the same number of output pins that are arranged in a generally square orientation with the same number of pins on each side of the integrated circuit package. Further, each of the pins on each of the packages has the same function as the pin in the corresponding position on the other package. Consequently, in the preferred embodiment, the first pattern and the second pattern of pin receptors are in the form of two square patterns of pin receptors formed on the printed circuit board with one pattern inset inside the other pattern and with a plurality of conductive traces interconnecting corresponding pin receptors in each pattern.

It will be appreciated that a printed circuit board having a first pattern of pin receivers configured to receive the pins of a first integrated circuit and a second pattern of pin receivers configured to receive the pins of a second integrated circuit, wherein the second pattern of pin receivers is positioned inside the first pattern of pin receivers, results in a footprint that can accommodate two integrated circuits having different pin configurations without requiring additional space on the printed circuit board for an extra pin configuration. The first and second integrated circuit packages are generally square in shape with an equal number of pinouts per side. In the preferred embodiment, this results in the ability to selectively use one of two separate keyboard controller integrated circuits on the same printed circuit board, which allows for great flexibility in choosing the keyboard controller based upon the cost and availability of the component.

These and other objects and advantages of the present invention will become more readily apparent from the following description taken in conjunction with the accompanying drawings.

DETAILED DESCRIPTION OF THE PREFERRED EMBODIMENTS

Figure 1:
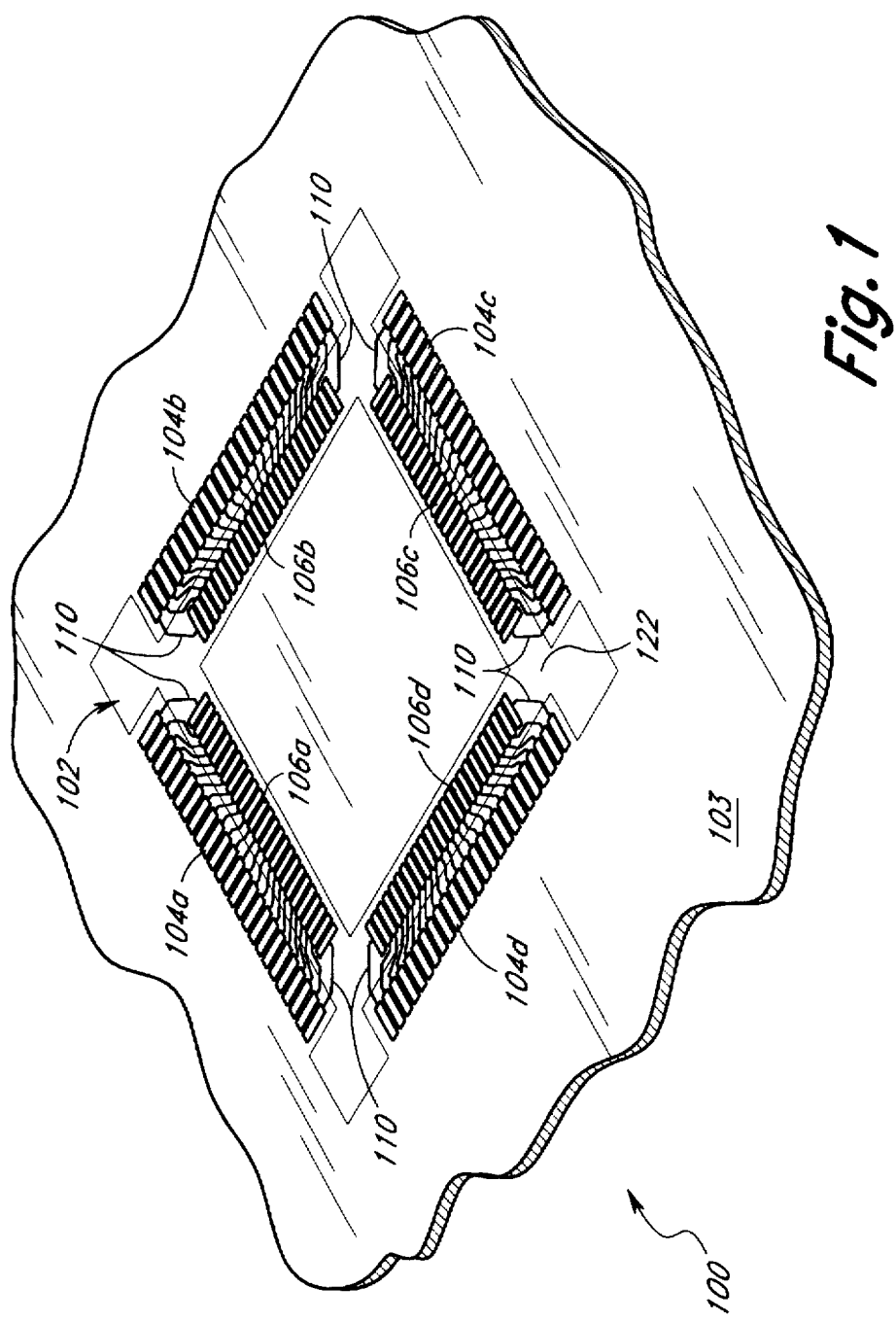
FIG. 1 is a perspective view of a printed circuit board having a footprint of pin receptors, wherein the footprint of pin receptors has a first plurality of pin receptors that are configured to receive the pins of a first integrated circuit and wherein the footprint of pin receivers includes a second plurality of pin receptors that are configured to receive the pins of a second integrated circuit.
Figure 2:
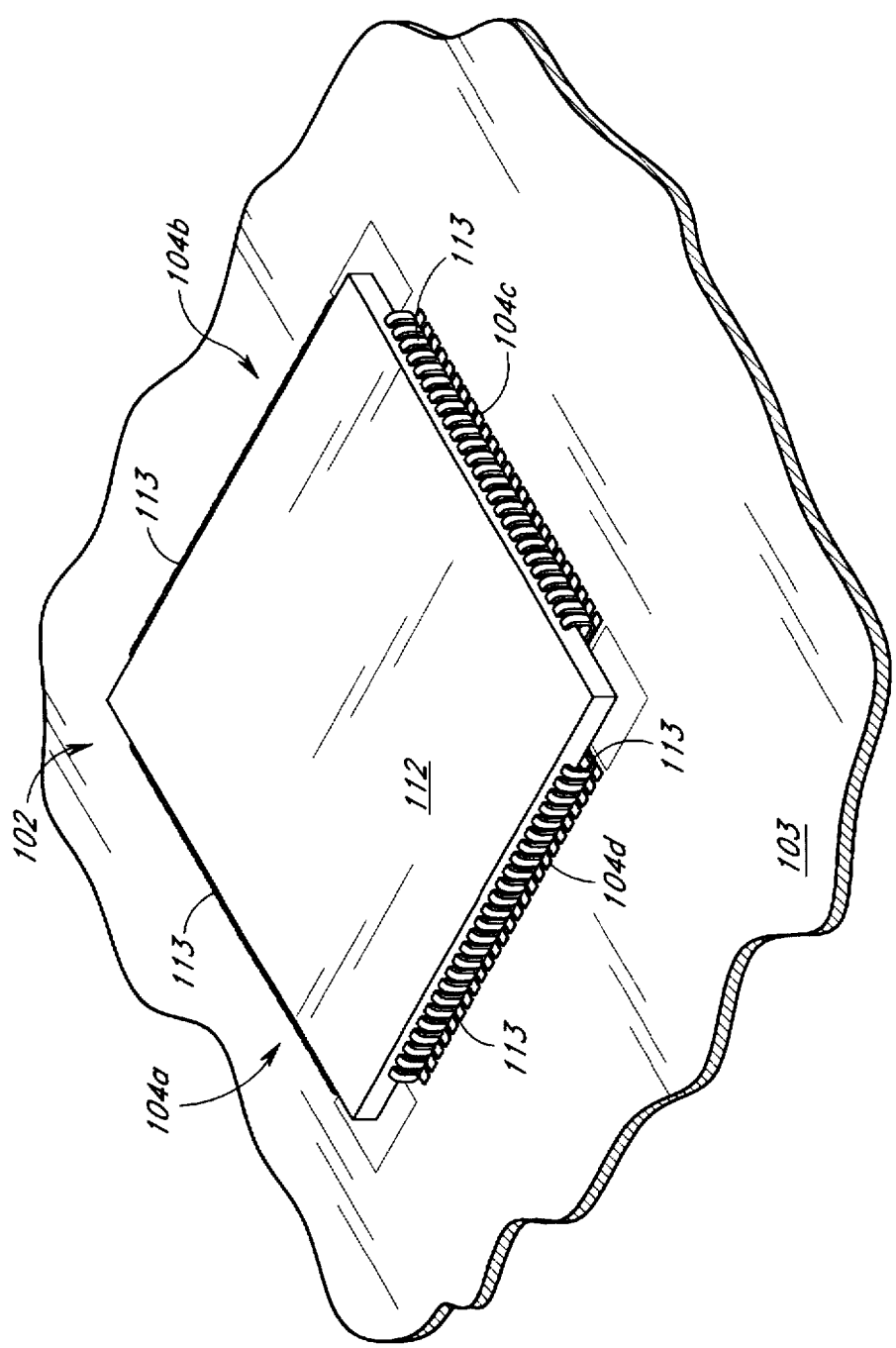
FIG. 2 is a perspective view of the printed circuit board of FIG. 1, wherein a first integrated circuit is positioned on the printed circuit board with the pins of the first integrated circuit positioned in alignment with the first plurality of pin receptors.

Reference will now be made to the drawings, wherein like numerals refer to like parts throughout. FIG. 1 illustrates a preferred embodiment of a first surface 103 of a printed circuit board 100 which has a footprint 102 of pin receptors. The footprint of pin receptors comprises a first plurality of pin receptors 104a–104d. In this embodiment of the preferred invention, there are four sets of 25 pin receptors 104 positioned in a generally square configuration on the first surface 103 of the printed circuit board 100. Specifically, the pin receptors 104 are positioned at right angles to each other to form a square 120. The square 120 of pin receptors 104 forms an outer boundary of a generally square area 122 of the printed circuit board 100. In the preferred embodiment, the pin receptors 104a–104d are positioned in the printed circuit board 100 and are configured to receive the pins on a first integrated circuit package 112 (FIG. 2) containing a PQFP-100SMD-type keyboard controller. As illustrated in FIG. 2, when the package 112 is mounted on the circuit boards so that the plurality of pins 113 on the package are positioned in alignment with the pin receptors 104a–104d, the package 112 covers the square area 122 of the printed circuit board 100.

As further illustrated in FIG. 1, the footprint of the pin receptors 102 includes a second plurality of pin receptors 106a–106d, which are formed in the square area 122 inside the square boundary 120 formed by the first plurality of pin receptors 104a–104d. Specifically, the pin receptors 106a–106d are positioned in a generally square configuration, with 25 pin receptors per side of the square, wherein each set of the pin receptors 106a–106d is formed in the area 122 bounded by the first plurality of pin receptors 104a–104d.

Figure 3:
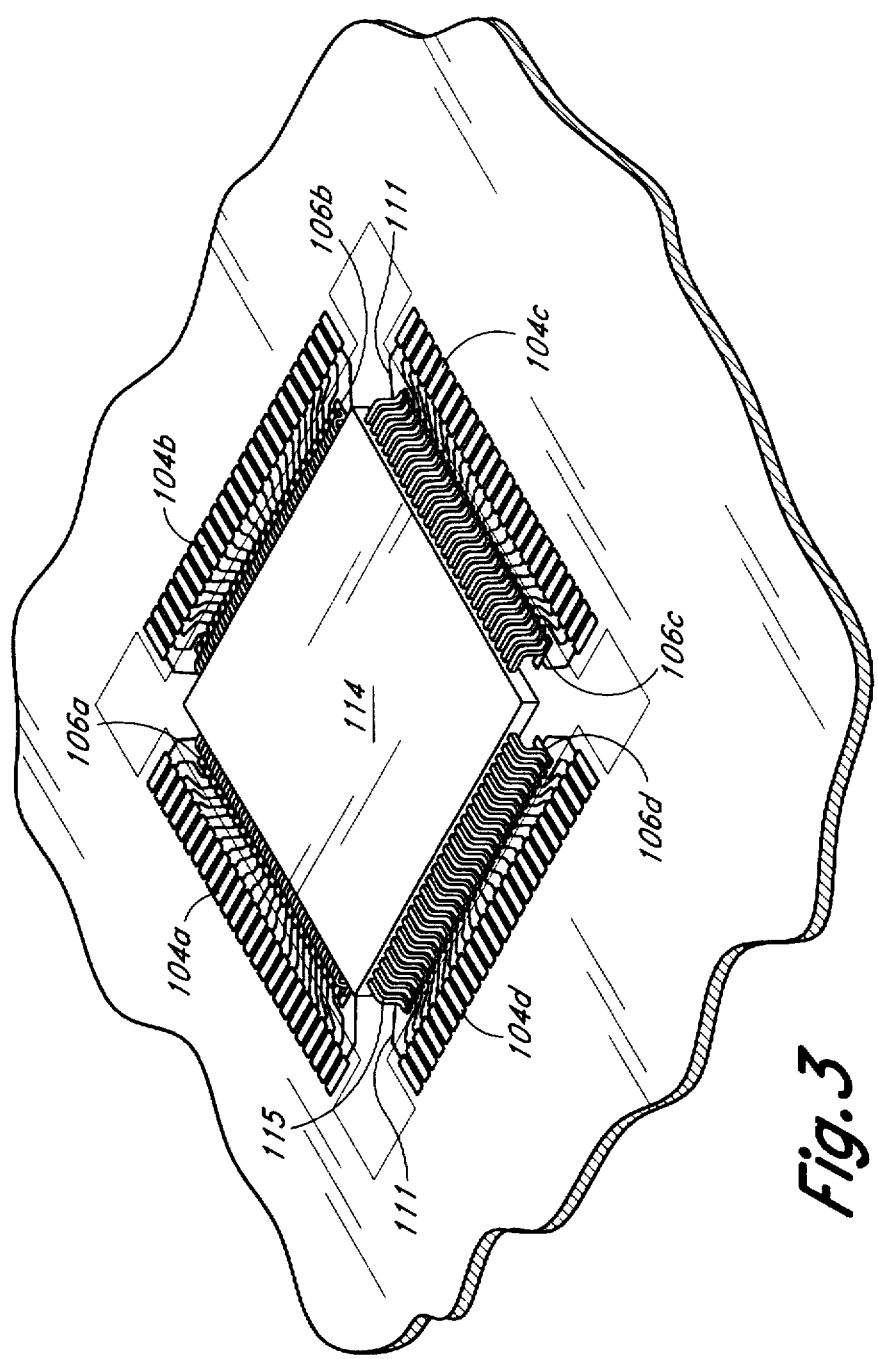
FIG. 3 is a perspective view of the printed circuit board of FIG. 1, wherein a second integrated circuit is positioned in the footprint on the printed circuit board so that the pins of the second integrated circuit are positioned in alignment with the second plurality of pin receptors.

The plurality of pin receptors 106a–106d have substantially the same configuration as the plurality of pin receptors 104a–104d with the exception that the area of the printed circuit board 100 occupied by the plurality of pin receptors 106a–106d is uniformly smaller because the pin receptors 106a–106d are spaced closer together than the pin receptors 104a–104d. The second plurality of pin receptors 106a–106d are configured to receive the pins from a second integrated circuit package 114 (FIG. 3).

In the illustrated embodiment, the integrated circuit packages 112, 114 for the two types of keyboard controllers have the same signals on corresponding pins (e.g., pin 1 of the first integrated circuit package 112 has the same signal as pin 1 of the second integrated circuit package 114; pin 2 of each integrated circuit has the same signal; and so forth). Thus, the signals on the two integrated circuits are in the same order from pin 1 through pin 100. Hence, the second plurality of pin receptors 106a–106d are in the same sequential order as the first plurality of pin receptors 104a–104d for corresponding signals. A plurality of conductive traces 110 are formed between corresponding ones of the pin receptors 104a–104d and 106a–106d of the printed circuit board 100 to electrically interconnect each of the corresponding pin receptors 104a–104d and 106a–106d.

The second plurality of pin receptors 106a–106d are preferably positioned in the area 122 of the circuit board 100 and are preferably configured to receive the pins on the second integrated circuit package 114 (FIG. 3) of a TQFP-100SMD-type keyboard controller. This type of keyboard controller has a similar package configuration as the PQFP-100SMD-type keyboard controller with the same pin configuration with the exception that the package 114 is proportionately smaller because the pins are closer together.

As illustrated in FIG. 2, the first integrated circuit package 112 can be positioned so that the plurality of pins 113 on the integrated circuit 112 are positioned on the first plurality of pin receptors 104a–104d forming the first pattern or footprint. The pins of the integrated circuit 114 are then soldered to the pin receptors 104a–104d in a conventional manner (e.g., by wave soldering, or the like). As further illustrated in FIG. 3, the second integrated circuit package 114 can be positioned on the printed circuit board 100 so that the plurality of pins 115 of the package 114 are positioned on the second plurality of pin receptors 106a–106d forming the second pattern or footprint. Preferably, each of the first plurality of pin receptors 104a–104d is connected to one or more conductive traces (not shown) which interconnect the pin receptor to other devices (not shown) positioned on the printed circuit board 100. It will be appreciated that since the pin receptors 106a–106d are connected by the conductive traces 111 to the pin receptors 104, the pin receptors 106 are also connected in the same fashion to other electrical components mounted on the printed circuit board.

It will also be appreciated that the footprint of the pin receptors 104a–104d, 106a–106d of the preferred embodiment is capable of receiving one of two different integrated circuits having different pin configurations. This allows the manufacturer of the printed circuit board to purchase integrated circuits from two different suppliers and still have the printed circuit board perform its desired function. Further, since the second plurality of pin receptors 106 are formed in the area 122 of the printed circuit board 100 that is not otherwise accessible when the first package 112 is mounted on the printed circuit board 100, the addition of the second plurality of pin receptors 106 in the area 122 allows for two different packages 112 and 114 to be used interchangeably without requiring the utilization of any additional space on the printed circuit board 100.

Although the forgoing description of the preferred embodiments of the present invention has shown, described and pointed out the fundamental novel features of the invention, it will be understood that various omissions, substitutions, and changes in the form or the detail of the apparatus as illustrated, as well as the uses thereof, may be made by those skilled in the art without departing from the spirit of the present invention. Consequently, the scope of the invention should not be limited to the foregoing discussion, but should be defined by the appended claims.

What is claimed is:

1. A printed circuit board comprising:
   a first plurality of pin receptors formed in a first area of said board, wherein said first plurality of pin receptors define the outer boundary of a second area of said printed circuit board and wherein said first plurality of pin receptors are configured to receive a plurality of pins on a first integrated circuit package so that, when said first integrated circuit package is positioned on said printed circuit board, said first integrated circuit package covers said second area;
   a second plurality of pin receptors formed entirely in said second area of said printed circuit board wherein said second plurality of pin receptors are configured to receive a plurality of pins on a second integrated circuit package wherein both said first and said second integrated circuit package contain integrated circuits that perform the same function and have corresponding input and output pins;
   a plurality of traces interconnecting pin receptors in said first plurality of pin receptors with corresponding pin receptors in said second plurality of pin receptors;
   wherein both said first and said second plurality of pin receptors are formed in said printed circuit board generally in the form of a square;
   wherein said first integrated circuit package has a first number of pins that are oriented so as to form a generally square footprint and wherein said second integrated circuit package also has a first number of pins also oriented so as to form a generally square footprint; and
   wherein said first plurality of pin receptors and said second plurality of pin receptors each have said first number of pin receptors and wherein both said first and said second plurality of pin receptors have equal number of pin receptors on each side of said square.

2. The printed circuit board of claim 1, wherein each of said pin receptors in said first plurality of pin receptors is connected by one of said plurality of conductive traces to a pin receptor in said second plurality of pin receptors that occupies a corresponding location in said square formed by said second plurality of pin receptors.

3. The printed circuit board of claim 2, wherein said first plurality of pin receptors are configured to receive a PQFP-100SMD-type keyboard controller and wherein said second plurality of pin receptors are configured to receive a TQFP-100SMD-type keyboard controller.

4. A printed circuit board comprising:
   a first plurality of pin receptors of a first type formed in a first area of said board wherein said first plurality of pin receptors are arranged in a generally square pattern in said first area of said printed circuit board so that said first plurality of pin receptors define an outer boundary of a second area of said printed circuit board;
   a second plurality of pin receptors of said first type formed in said second area of said board, wherein said second plurality of pin receptors are arranged in a generally square pattern in said second area of said printed circuit board;
   a plurality of conductive traces interconnecting pin receptors in said first plurality of pin receptors with corresponding pin receptors in said second plurality of pin receptors; and
   wherein both said first and said second plurality of pin receptors have the same number of pin receptors formed on each side of the square and wherein said plurality of conductive traces interconnect pin receptors in said first plurality of pin receptors with adjacent pin receptors in said second plurality of pin receptors.

5. The printed circuit board of claim 4, wherein said first plurality of pin receptors are configured to receive a plurality of pins of a first integrated circuit package and wherein said second plurality of pin receptors are configured to receive a plurality of pins on a second integrated circuit package wherein said first and said second integrated circuit packages perform the same function and have corresponding input and output pins.

6. The printed circuit board of claim 5, wherein said first plurality of pin receptors are configured to receive a PQFP-100SMD-type keyboard controller and wherein said second plurality of pin receptors are configured to receive a TQFP100SMD-type keyboard controller.

7. A method of forming a plurality of printed circuit boards comprising the steps of:
   forming a first plurality of pin receptors in a first area of each of said plurality of printed circuit boards wherein said first plurality of pin receptors are configured to receive a plurality of pins on a first integrated circuit package and are also configured so that said first plurality of pin receptors define the outer boundary of a second area on each of said plurality of printed circuit boards;
   forming a second plurality of pin receptors entirely in said second area of each of said plurality of printed circuit boards, wherein said second plurality of pin receptors are configured to receive a plurality of pins on a second integrated circuit package;
   forming conductive traces between pin receptors in said first plurality of pin receptors and corresponding pin receptors in said second plurality of pin receptors on each of said plurality of printed circuit boards;
   positioning said first integrated circuit package on at least a first one of said plurality of printed circuit boards so that said plurality of pins of said first integrated circuit package are engaged with said plurality of pin receptors in said printed circuit board and wherein said first integrated circuit package covers said second area of said printed circuit board;

positioning a second integrated circuit package on at least a second one of said plurality of circuit boards so that said plurality of pins of said second integrated circuit package engage with said plurality of pin receptors in said printed circuit board and wherein said first and said second integrated circuit packages contains integrated circuits which perform a first function and wherein said at least a first one of said plurality of printed circuit boards and said at least a second one of said plurality of printed circuit boards perform the same function after said positioning steps;

wherein the step of forming said first plurality of pin receptors comprises forming said first plurality of pin receptors in the configuration of a square wherein said first square defines the outer boundary of said second area;

wherein the step of forming said second plurality of pin receptors comprises forming said second plurality of pin receptors in the configuration of a second square wherein said second square is smaller in area than said first square and the sides of said second square are parallel the side of said first square; and wherein the forming steps comprises forming a first square of first pin receptors and a second square of second pin receptors wherein each side of said first and second squares have the same number of pin receptors and wherein said step of forming said conductive traces comprises forming conductive traces between corresponding pin receptors in said first and said second squares.

8. The method of claim 7, wherein said step of forming said first plurality of pin receptors comprises forming pin receptors configured to receive a PQFP-100SMD-type keyboard controller and wherein said step of forming said second plurality of pin receptors comprises forming pin receptors configured to receive a TQFP-100SMD-type keyboard controller.

* * * * *

UNITED STATES PATENT AND TRADEMARK OFFICE
CERTIFICATE OF CORRECTION

PATENT NO. : 5,777,853
DATED : July 7, 1998
INVENTOR(S) : Mitchell G. Dorfmeyer

It is certified that error appears in the above-identified patent and that said Letters Patent is hereby corrected as shown below:

Title page,
Change "HAVING A DUAL" to -- HAVING DUAL --.

Signed and Sealed this

Ninth Day of April, 2002

Attest:

JAMES E. ROGAN
Attesting Officer
*Director of the United States Patent and Trademark Office*

UNITED STATES PATENT AND TRADEMARK OFFICE
CERTIFICATE OF CORRECTION

PATENT NO.  : 5,777,853
DATED       : July 7, 1998
INVENTOR(S) : Mitchell Dorfmeyer It is certified that error appears in the above-identified patent and that said Letters Patent is hereby corrected as shown below:

<u>Title Page,</u>
Item [54], Title, change "PRINTOUTS PER SIZE" to -- PINOUTS PER SIDE --.

Signed and Sealed this

Third Day of December, 2002

JAMES E. ROGAN
*Director of the United States Patent and Trademark Office*